United States Patent [19]
Hsu et al.

[11] Patent Number: 5,486,867
[45] Date of Patent: Jan. 23, 1996

[54] HIGH RESOLUTION DIGITAL PHASE DETECTOR

[75] Inventors: De D. Hsu, San Diego, Calif.;
Frederick A. Williams, Bellevue, Wash.; Wendy L. Liu, San Diego, Calif.

[73] Assignee: Raytheon Company, Lexington, Mass.

[21] Appl. No.: 159,975

[22] Filed: Nov. 30, 1993

[51] Int. Cl.⁶ .................................................. H04N 5/04
[52] U.S. Cl. .......................... 348/516; 348/572; 375/294; 327/78
[58] Field of Search ........................ 348/500, 497, 348/512, 516, 537, 572, 538, 525; 331/20, 172; 375/110, 106, 17, 20; 307/362, 354; H04N 5/04

[56] References Cited

U.S. PATENT DOCUMENTS

| | | | |
|---|---|---|---|
| 4,434,439 | 2/1984 | Steckler et al. | 348/572 |
| 4,775,890 | 10/1988 | Balaban et al. | 348/540 |
| 4,831,378 | 5/1989 | Baars et al. | 348/572 |
| 4,959,558 | 9/1990 | Kay et al. | 307/362 |
| 5,293,369 | 3/1994 | Melas et al. | 307/354 |

OTHER PUBLICATIONS

TRW LSI Products, Inc. TMC22070 Advance Information, "Genlocking Video Digitizer", Jan. 21, 1992, pp. 1–4.

*Primary Examiner*—James J. Groody
*Assistant Examiner*—Jeffrey S. Murrell
*Attorney, Agent, or Firm*—William R. Clark

[57] ABSTRACT

A high resolution digital phase detector adapted to receive a threshold value and a sequence of digital samples of a substantially linear portion of an analog video signal. A first output signal is provided when a digital sample is detected as having crossed the threshold value. An interpolation is done between the value of the digital sample to first cross the threshold value and the immediately preceding digital sample on the opposite side of the threshold value. In such manner, the time of the crossing within the sample interval is resolved to a subpixel level. A second output signal represents a fractional phase error between the actual crossing and a desired crossing point within the sample interval. The first and second signals are added in a phase locked loop to adjust the output of a voltage controlled oscillator to be synchronized to the incoming analog video signal in both integer and subpixel phase.

26 Claims, 4 Drawing Sheets

HIGH RESOLUTION DIGITAL PHASE DETECTOR

BACKGROUND OF THE INVENTION

The field of the invention generally relates to digital phase detectors, and more particularly relates to digital detectors used in the detection of digital samples of an analog signal having a substantially linear synchronization region wherein subclock detection resolution is desirable.

As is well known, phase detectors generally compare the relative phase relationship of two signals, e.g., a reference signal and a secondary signal. Typically, a phase detector is combined with a low pass filter to provide an output signal having an amplitude related to the phase difference of the input signals.

One common application of a phase detector is in a phase locked loop wherein a locally generated signal is synchronized with a reference signal. The local signal may be generated by a voltage controlled oscillator or VCO which is controlled by the output signal of the phase detector. The reference signal or some subsignal thereof is applied to one input of the phase detector and the VCO or some subsignal thereof is applied to a second input of the phase detector. For the condition of the two signals being out of phase, the phase detector output will be of such amplitude to cause the VCO to increase or decrease in frequency tending to bring its output signal in coincidence with the reference.

In one specific phase detection application commonly referred to genlocking, the reference signal is a video signal such as a standard PAL or NTSC television signal, and a sync detector is used to provide an output signal in coincidence with the horizontal line sync pulse. For example, a threshold signal is typically set to the mid-level of the horizontal sync pulse transition, and the sync detector provides an output signal when the video signal crosses the threshold. In one arrangement, a device responsive to a VCO output is used to generate a local sync signal corresponding to the sync detector output, and the relative phase of these two corresponding sync signals is phase detected to provide a control signal used in a phase locked loop to control the VCO. In such manner, the local VCO is synchronized to the incoming video signal.

In the above described arrangement and others, infinite resolution is theoretically provided by an analog sync detector, or more generally a phase detector in a phase locked loop. In particular, when a voltage comparator is used and the inputs are the analog video signal and a threshold voltage, the resolution of the output is theoretically infinite. Stated differently, the output always occurs at the same relationship between the analog video signal and the threshold voltage, so the exact time that the analog video signal crosses the threshold can readily be determined. However, with a digital sync detector, the phase detecting resolution is finite as determined by the time interval between samples. In particular, the threshold voltage is converted to a digital threshold value to which the values of the digital samples are compared. When a sequence of digital samples are of greater (or lesser) value than the threshold value, and then one sample is detected with lesser (or greater) value than the threshold value, it is known that the digital threshold value has been crossed. However, the exact time of crossing—or more precisely, the exact time of the analog signal crossing the threshold voltage—is not known. Viewed simply, the time that the digitized video signal crossed the threshold is not infinitely resolved because the crossing could have occurred at any time within the time interval between two successive samples, one occurring before and the other occurring after the crossing. Therefore, in the above described application and others, the VCO output can jitter as the relative position of the threshold value within sample intervals varies from sync pulse to sync pulse. One way to increase the resolution within the digital phase locked loop is to increase the sample rate so that the time interval between samples is reduced. However, the sample clock frequency may be constrained by other parameters of the system.

SUMMARY OF THE INVENTION

In accordance with the invention, apparatus is adapted to receive a threshold value and a sequence of digital samples of a substantially linear portion of an analog signal wherein the sequence of digital samples crosses the threshold value. For example, the digital samples may be of a television composite video signal, and threshold value may correspond to a midpoint voltage level of a transition of a horizontal sync pulse. The apparatus comprises a threshold crossing detector means for providing a first output signal when a first one of the digital samples is detected as having crossed the threshold value. The apparatus also comprises means for providing a second output signal in accordance with the fractional position of the threshold value between the value of the first one of the digital samples to cross the threshold value and the value of a preceding digital sample before the threshold was crossed.

It is preferable that the threshold crossing detector means comprise means for detecting a sign difference between $S(i)$-T and $S(i-1)$-T where $S(i)$ is the value of the first digital sample to cross the threshold, $S(i-1)$ is the value of the immediately preceding digital sample before the threshold was crossed, and T is the value of the threshold. The second output signal providing means may preferably comprise means for comparing the threshold value to an interpolated value such as at the midpoint between the values of $S(i)$ and $S(i-1)$. Further, it may comprise means for comparing the threshold value to successive iteration values between the midpoint value and the closer one of the values $S(i)$ and $S(i-1)$.

The invention may also be practiced by apparatus comprising an analog to digital converter means responsive to an analog signal having periodic substantially linear synchronization regions for providing a sequence of digital samples at intervals in accordance with a pixel sample clock and means for providing a threshold value corresponding to a predetermined level of the synchronization region of the analog video signal. The apparatus also comprises synchronization detector means responsive to the threshold value and the sequence of digital samples for providing a first control signal when a first one of the sequence of digital samples crosses the threshold value. The synchronization detector means further comprises means for interpolating between $S(i)$ and $S(i-1)$ to provide a second control signal representative of when the threshold signal was crossed during the time interval between $S(i)$ and $S(i-1)$. There is also a means responsive to the first and second control signals for adjusting the pixel sample clock to synchronize the pixel sample clock with the analog video signal and to cause the pixel sample clock to have a subpixel phase wherein a subsequent crossing of the threshold value occurs at a predetermined position in the time interval between two consecutive samples where one of the samples occurs before and the other after the subsequent crossing. For example, the predetermined position could be the midpoint between the two consecutive samples.

With such arrangement, the values of S(i), S(i−1), and T are processed to determine the fractional or relative position of T between S(i) and S(i−1). Because the detection region of the analog signal is linear, the fractional position is representative of When the threshold was crossed during the time interval between digital samples S(i) and S(i−1). Thus, by interpolating between the values of S(i) and S(i−1), a phase error between the crossing and a predetermined point in the sample interval is determined to subclock resolution. Therefore, this subclock or fractional interval phase error can be and is used to adjust the subpixel phase of a local clock to provide a predetermined relationship between subsequent threshold crossings and the corresponding sample intervals at the time of such crossings. For example, all subsequent crossings can be made to occur at midpoints of sample intervals. Therefore, the local clock is further stabilized without increasing the sample rate, and subclock or subpixel jitter is reduced or eliminated.

BRIEF DESCRIPTION OF THE DRAWINGS

The foregoing objects and advantages will be more fully understood with reference to the drawings wherein.

DESCRIPTION OF THE PREFERRED EMBODIMENT

Figure 1:
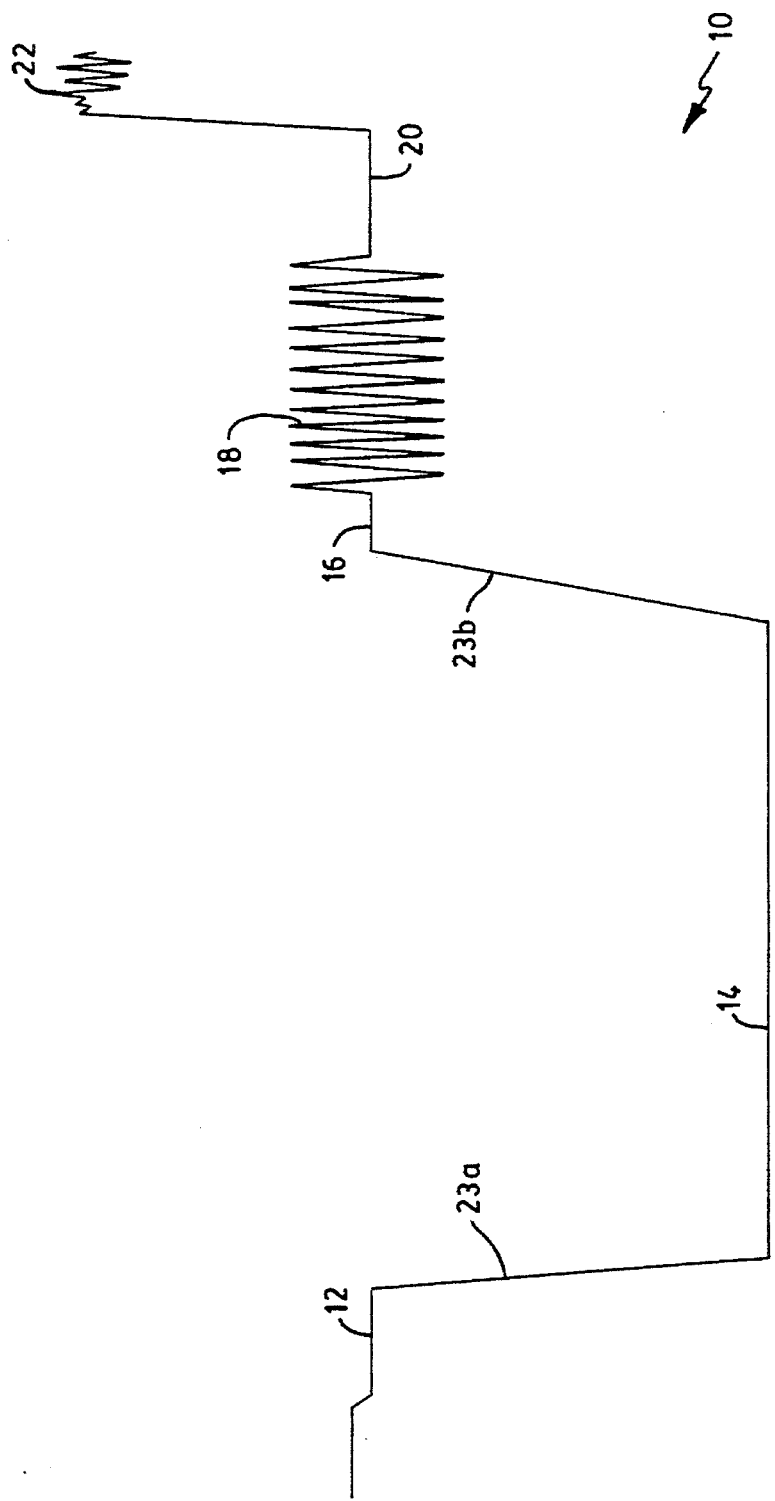
FIG. 1 is a waveform representing a horizontal sync portion of an analog television signal.

Referring to FIG. 1, a conventional horizontal blanking signal 10 such as for a PAL or NTSC analog television signal is shown. Horizontal blanking signal 10 includes what is commonly referred to as a front porch 12, a horizontal sync pulse 14, a back porch 16, a color burst 18, a breezeway 20, followed by the active video part 22. As can be seen, there are substantially linear transition regions 23a and b between front porch 12 and horizontal sync pulse 14, and between the horizontal sync pulse 14 and the back porch 16, respectively. As is well known, it is desirable to detect horizontal sync transition 23a, typically at a mid-level thereof.

Figure 2:
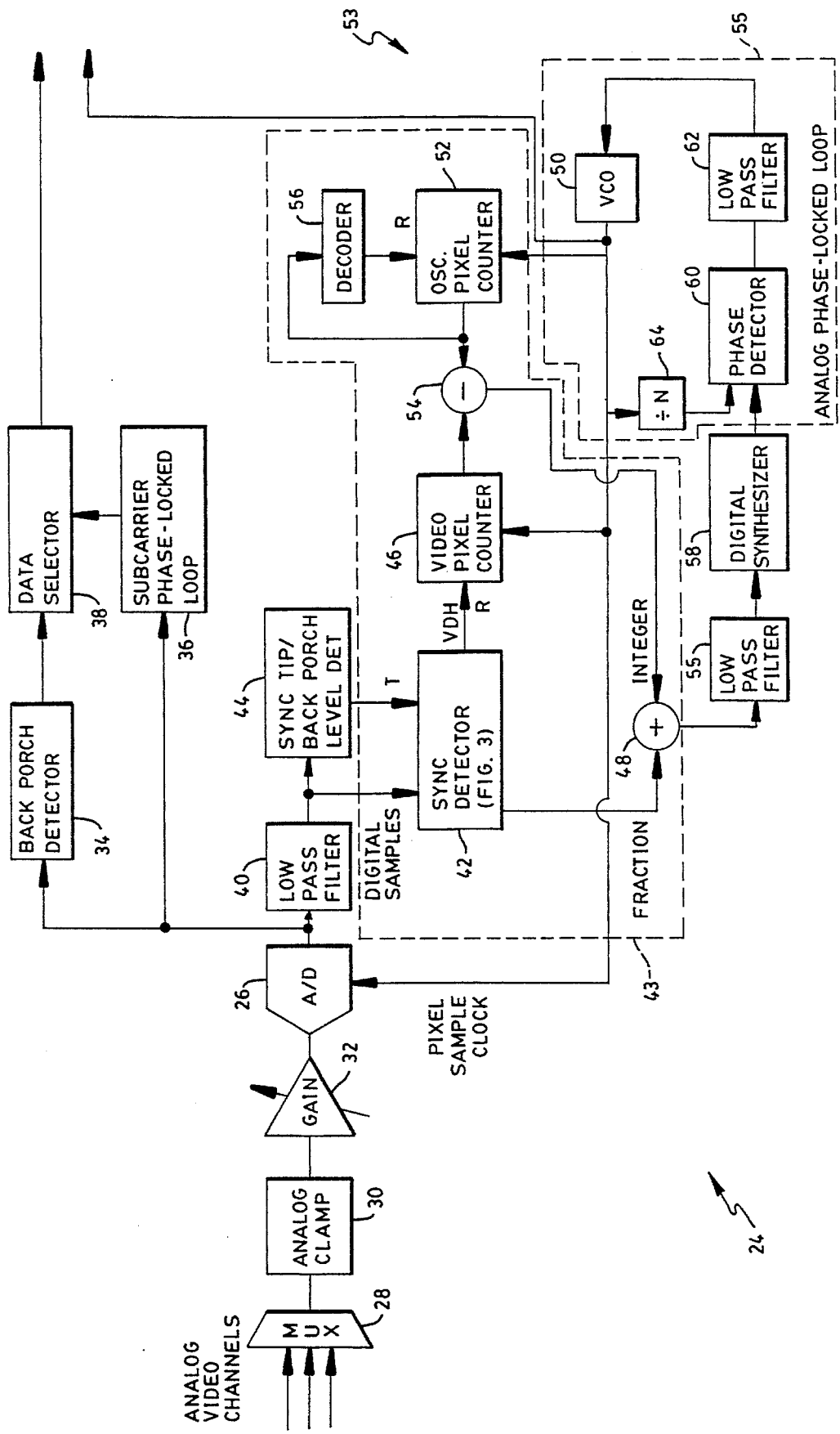
FIG. 2 is a block diagram of a portion of a video digitizer.

Referring to FIG. 2, a portion of a so called genlocking video digitizer 24 is shown. Under program control, genlocking video digitizer 24 converts standard baseband composite NTSC or PAL analog video into 8-bit digital composite video data. Digitizer 24 also extracts the horizontal and vertical sync signals, and generates a pixel sample clock for on-board analog to digital converter 26 and a clock for the transfer of data to subsequent video processing or decoding. In accordance with the invention, the extraction of the horizontal sync signals will be described in detail later herein.

Still referring to FIG. 2, program control (not shown) is used to control multiplexer 28 to accept one of three input channels providing standard baseband composite PAL or NTSC video. The front end analog clamp 30 ensures that the selected input video falls within the active range of analog to digital converter 26. Automatic gain control 32 then establishes the correct signal level for digitizing. The analog video is digitized by analog to digital converter 26 to provide a sequence of digital samples here having 8-bit quantization. In conventional manner, the time interval between samples is determined by the sample rate of the pixel sample clock from voltage controlled oscillator 50. The digitized composite video stream is fed to back porch detector 34 and subcarrier phase-locked loop 36. Back porch detector 34 is a digital clamp employed to ensure a constant blanking level by offsetting the digitized video data from analog to digital converter 26 to set the back porch level to a precise predetermined level for the respective PAL or NTSC formats. Subcarrier phase-locked loop 36 extracts the phase and frequency of the incoming color burst. These frequency and phase values are output along with the output of back porch detector 34 through data selector 38.

The digital samples of the digitized video from analog to digital converter 26 is also fed to low pass filter 40 which provides digital low-pass filtering to remove high frequency components from the digitized video that is fed to sync detector 42 which is part of digital phase detector 43. The low pass filter digitized video is also fed to sync tip/back porch detector 44 that provides threshold T to sync detector 42. More specifically, detector 44 provides a threshold value T here having a decimal value of 32 where the level of the sync tip of the horizontal pulse 14 as shown in FIG. 1 is set to a value of 0, and the level of front porch 12 is set to a value of 64. In other words, detector 44 provides a digital threshold value, here 32, equal to the midpoint of transition 23a between the front porch 12 and the horizontal pulse 14 which here have decimal values of 64 and 0, respectively.

In addition to sync detector 42, digital phase detector 43 includes video pixel counter 46, subtractor 54, oscillator pixel counter 52, decoder 56, and adder 48. In a manner to be described in detail with reference to FIG. 3, sync detector 42 provides an output signal VDH to video pixel counter 46 whenever a sequence of digital samples of the input analog signal is detected crossing or passing the threshold T. Further, in accordance with the invention, sync detector 42 also provides to adder 48 fractional resolution data indicating the relative position of the threshold value T between two consecutive digital samples at the time of crossing the threshold value T. Voltage controlled oscillator 50 provides a pixel rate clock to video pixel counter 46 and oscillator pixel counter 52. The output of oscillator pixel counter 52 is fed to subtractor 54, and also to decoder 56 that here decodes a count of 780 for NTSC square pixel and resets oscillator pixel counter 52. Therefore, with 780 pixels per line for this example, oscillator pixel counter 52 essentially gets reset to zero once each line, assuming VCO 50 is synchronized to the analog video. Video pixel counter 46 also gets reset once each line by VDH as the sequence of digital samples crosses the threshold T. If the counts of the video pixel counter 46 and oscillator pixel counter 52 are the same, the output of subtractor 54 is 0 indicating that they are essentially in phase. In contrast, if the respective counts are not the same, subtractor 54 provides an INTEGER error signal. That is, subtractor 54 provides an output indicating that oscillator pixel counter 52 and video pixel counter 46 are out of phase by an integer number of pixels. In accordance with the invention, sync detector 42 also provides a FRACTION error signal to provide enhanced resolution, and the INTEGER and FRACTION signals are added in adder 48.

A digital phase locked loop 53 includes digital phase detector 53, low pass filter 55, digital synthesizer 58, and analog phase-locked loop 55 which includes phase detector 60, low pass filter 62, VCO 50, and divide-by-N device 64. The output of adder 48 which is an INTEGER plus FRACTION error signal is fed to low pass filter 56 and then digital synthesizer 58 which provides an analog signal in accordance with the INTEGER plus FRACTION error signal. The analog output of digital synthesizer 58 is fed to phase detector 60 which also receives an input from divide-by-N device 64, and has an output coupled to low pass filter 62. The output of low pass filter 62 is fed to voltage controlled oscillator 50. The output of voltage controlled oscillator 50 is fed to divide-by-N device 64. Thus, there is a smaller analog phase locked loop 55 inside a larger digital loop 53. With such arrangement, the output of voltage controlled oscillator 50 is substantially stabilized at some multiple, here N, of the output of digital synthesizer 58.

Figure 3:
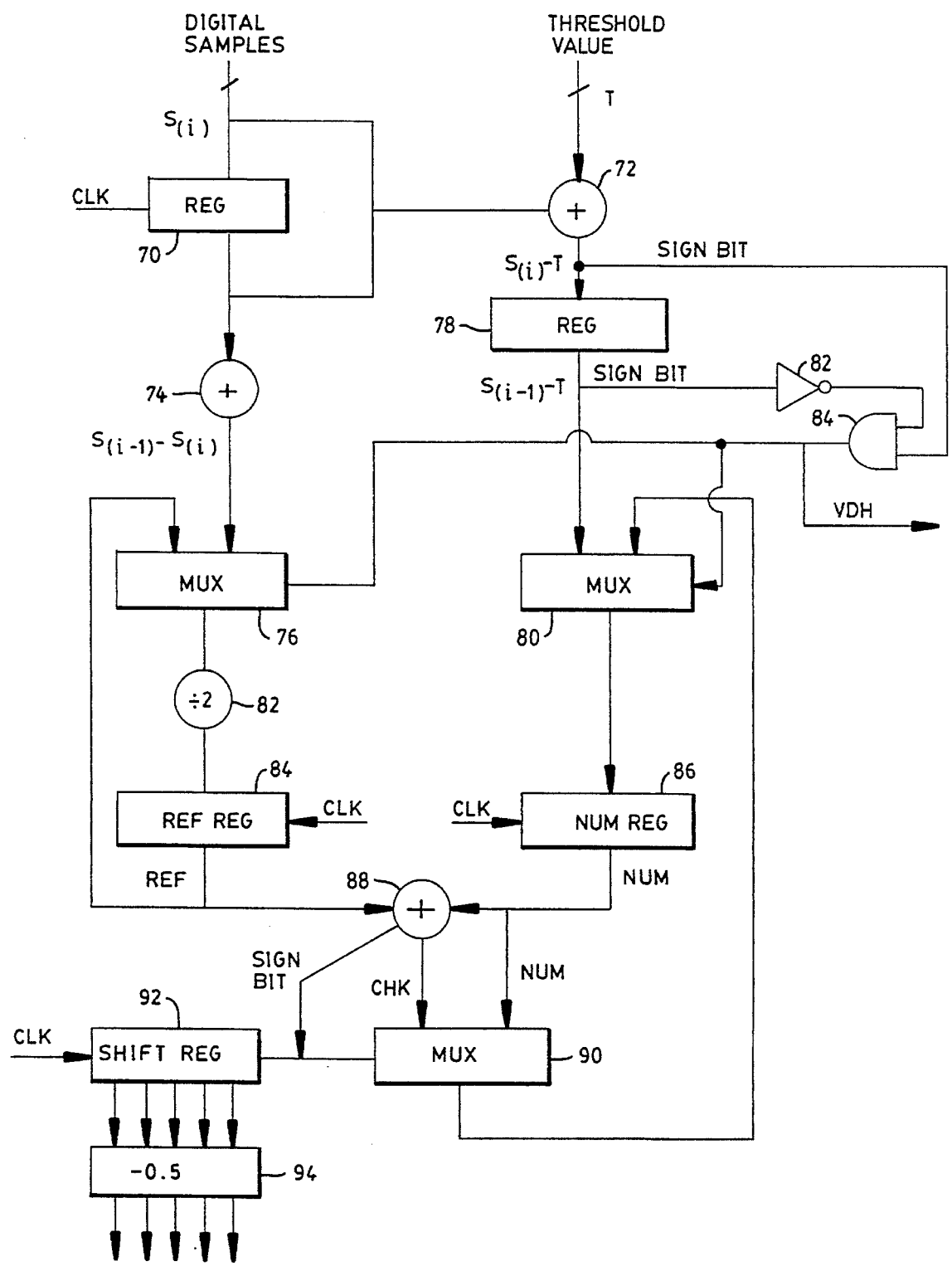
FIG. 3 is flow diagram of the sync detector of FIG. 2.

Referring to FIG. 3, sync detector 42 here receives from low pass filter 40 a sequence of digital samples of which the current sample is S(i). Although those skilled in the art will recognize that the principles of sync detector 42 can be used to advantage in a variety of applications involving detection of digital samples that are rising or falling past a threshold detection value, S(i) is here the current sample of an 8-bit digitized video signal. In particular, at the time of interest, S(i) is the digitized output from a horizontal blanking interval 10, and more specifically the substantially linear transition region 23a as shown in FIG. 1. As described earlier, sync detector 42 also receives a threshold value T which, in the present example, corresponds to the mid-point voltage between the back porch 12 and the level of the sync tip 14. In particular, with reference to FIG. 4B, the sync tip level of the horizontal sync pulse 14 is assigned a decimal value of 0 and the back porch 12 is scaled to a decimal value of 64, so threshold T here has a decimal value of 32.

S(i) is coupled to register 70 and adders 72 and 74. S(i) is clocked into register 70 by CLK, and when a new S(i) becomes available at the input to register 70 and adder 74, the stored output of register 70 is the previous or immediately preceding sample, now S(i−1). Adder 74 subtracts the current sample S(i) from the preceding sample S(i−1), and therefore presents S(i−1)-S(i) to one input of multiplexer 76.

Adder 72 subtracts threshold value T from the value of the current sample S(i), and therefore S(i)-T is clocked into register 78 by CLK. When a new S(i) becomes available, the stored output of register 78 is S(i−1)-T which is coupled to one input of multiplexer 80. The sign bit of S(i)-T from adder 72 and the sign bit of S(i−1)-T register 78 as inverted by invertor 82 are coupled to AND gate 84. Therefore, AND gate 84 provides an output signal VDH wherever the digitized video crosses the threshold value T (i.e. when S(i) and S(i−1) are on opposite sides of threshold T). More specifically, with reference to FIG. 4, threshold T is here assumed to have a value of 32, so AND gate 84 only provides a VDH output when one of two consecutive samples, S(i) or S(i−1), is larger than 32, and the other is smaller. Which one is larger depends on whether the sequence of digital samples is rising or falling. The output signal VDH from AND gate 84 is fed as a control signal to multiplexers 76 and 80, and is used to select respective values S(i−1)-S(i) and S(i−1)-T when a digital sample S(i) is detected as having crossed threshold T. At all other times, the opposite input of respective multiplexers 76 and 80 is selected. The output of multiplexer 76 is divided by 2 in divider 82, and loaded into reference register 84 by CLK. The output of reference register 84 which is hereafter referred to as REF is fed back as the second input to multiplexer 76. REF is selected by multiplexer 76 at all times except when the digitized video crosses threshold T. The output of multiplexer 80 is loaded into numerator register 86 by CLK. The output of numerator register 86 is hereafter referred to as NUM. Adder 88 subtracts REF from NUM to provide CHK which is fed as one input to multiplexer 90, which receives NUM as the other input. The sign bit of CHK is loaded into shift register 92 by CLK, and also is used to control the selection of multiplexer 90. In particular, if CHK is zero (i.e. REF= NUM) or has a positive sign bit, a logical 1 is shifted into shift register 92, and CHK is selected by multiplexer 90 for feeding to multiplexer 80. As described earlier, CHK will then be selected by multiplexer 80 for loading into numerator register 86 except if the digitized video is crossing the threshold T. If CHK has a negative sign bit, a logical 0 is shifted into shift register 92, and NUM is selected by multiplexer 90 for feeding to multiplexer 80. The output of shift register 92 is coupled to a −0.5 fractional subtractor 94.

Figures 4A, 4B:
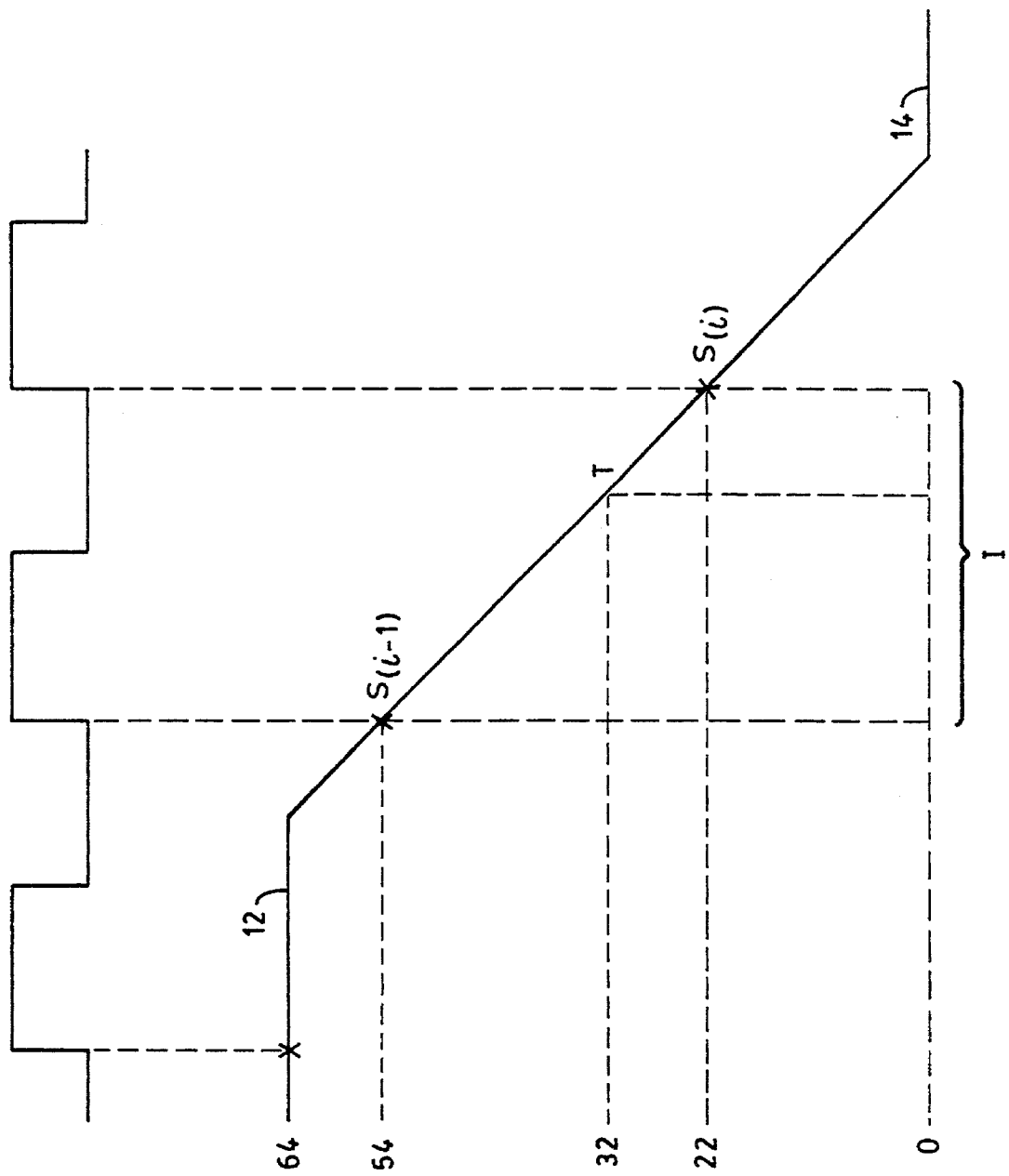
FIGS. 4A and 4B show a pixel sample clock and a sampled waveform of the falling transition of a horizontal sync pulse, respectively.

The operation of sync detector 42 is more readily understood with reference to an example as shown in FIG. 4B. Here, there is shown a substantially linear transition 23a from the front porch 12 to a horizontal sync pulse 14 as shown in FIG. 1. As described earlier, the sync tip level of the horizontal sync pulse 14 is set to a decimal value of 0, and the level of front porch 12 is scaled to a decimal value of 64. The mid-point of the falling transition has a decimal value of 32, and sync tip/back porch level detector provides this value in the manner described heretofore. With reference to FIG. 4A which shows the timing pulses of the pixel sample clock with sampling on the rising edges, the current sample S(i) here has a decimal value of 22, which has crossed the threshold value of 32 since the preceding sample S(i−1) had a decimal value of 54. With reference to FIG. 3, the illustrative example of FIG. 4B, and the Table below, REF, NUM and the contents of shift register 92 are not defined before the first clock pulse.

TABLE

| Clock | REF | NUM | CHK | Shift Reg. 92 |
|---|---|---|---|---|
| 0 | | | | xxxxx |
| 1 | 16 | 22 | +6 | xxxxx |
| 2 | 8 | 6 | −2 | xxxx1 |
| 3 | 4 | 6 | +2 | xxx10 |
| 4 | 2 | 2 | 0 | xx101 |
| 5 | 1 | 0 | −1 | x1011 |
| 6 | | | | 10110 |

After the first clock pulse, [S(i−1)-S(i)]/2 is clocked into reference register 84 as REF, and S(i−1)-T is clocked into numerator register 86 as NUM. Thus, for the example of FIG. 4B where S(i−1) is 54, T is 32, and S(i) is 22, REF is 16, and NUM is 22. Thus, CHK, which is NUM-REF, is +6. The sign bit is +, so a logical 1 is clocked into shift register 92 as the most significant bit on the second clock pulse. Because the CHK sign bit is +, multiplexer 90 is controlled to feed CHK back through multiplexer 80 where it is clocked into numerator register 86. That is, 6 is clocked into numerator register 86 by the second clock pulse. REF, which is 16, is fed back through multiplexer 76 and divide-by-2 divider 82, so a value of 8 is clocked into reference register 84 on the second clock pulse. The value of CHK is −2 after the second clock pulse, so a logical 0 gets clocked into shift register 92 by the third clock pulse. Because the sign bit is −, NUM, which is 6, is selected by multiplexer 90 for feeding back through multiplexer 80 for clocking into numerator register 86 by the third clock pulse. Once again, REF is fed back around and halved, so a value of 4 is loaded into reference register 84 by the third clock pulse. Now, the value of CHK is +2 (6−4), so a logical 1 is clocked into shift register 92 by the fourth clock pulse. CHK which has a value of 2 is fed back and loaded into numerator register 86 by the fourth clock pulse, and half the value REF or 2 is loaded into reference register 84. CHK then has a value of 0 (2–2) which is processed in the same manner as a positive sign bit, so a 1 is loaded into shift register 92 by the fifth clock pulse. CHK is fed back to numerator register 86, and half the value of REF or 1 is loaded into register 84 as REF. Therefore, CHK has a value of −1 (0−1), so a logical 0 is loaded into shift register 92 on the sixth clock pulse.

The value of shift register 92 is fed to 0.5 subtractor 94. Thus, for the example described above with reference to FIG. 4B, sync detector 42 would provide a FRACTION phase error output of 00110 which indicates that the midpoint of the two consecutive samples of S(i) and S(i−1) at the time of crossing the threshold is displaced from threshold value T by 0.1875 of the decimal interval. In particular, the midpoint of the digital sample is 38 and the threshold value T is 32, so the deviation or displacement is 6 or 0.1875×32. In such manner, sync detector 42 generates a FRACTION error signal corresponding to the relationship or relative position of threshold T between two consecutive pulses when the threshold is crossed. Those skilled in the art will recognize that the fractional error signal FRACTION could be derived by other simpler algorithms such as ones not using subtractor 94. However, the algorithm of FIG. 3 was implemented for reasons not related to the present invention. Simply stated, subtractor 94 here provides a bias to obtain a fractional phase error signal that adjusts the subpixel phase relationship to a desired result for the implemented algorithm of sync detector 42.

Considering one further example where S(i) has a value of 16 and S(i−1) has a value of 48 such that threshold T of 32 is equally spaced therebetween, a digital word of 10000 would be loaded into shift register 92. Subtracting 0.5 in subtractor 94 yields a FRACTION error signal of zero. Thus, when the threshold value is at the mid-point of the values for S(i) and S(i−1), no fractional correction signal is generated. However, if threshold T is not at the mid-point between S(i) and S(i−1), a FRACTION error signal corresponding to the magnitude and direction of displacement is generated.

Referring again to FIG. 4B, it will be noticed that because transition 23a is substantially linear, the relative 10 position of the threshold value T between the values of S(i) and S(i−1) as shown on the vertical axis corresponds to or is directly proportional to the relative position of the crossing of the threshold T within the time interval I between S(i−1) and S(i). Thus, by using the values of S(i), S(i−1), and T in the manner heretofore described, an error signal representative of time of the crossing of the threshold T within the time interval between S(i−1) and S(i) is provided. That is, the resolution of the crossing within the sample period is enhanced without increasing the rate of the pixel sample clock (i.e. reducing the sample time interval). Simply stated, an interpolation between the values of S(i−1) and S(i) has provided increased resolution in the digital domain without additional samples, and the interpolated data is used to determine more precisely when the threshold value T was crossed. The error signal FRACTION is therefore representative of the subpixel or subclock phase difference between the crossing of the threshold value T and a predetermined point in the sample interval, here the midpoint between S(i−1) and S(i).

Referring again to FIG. 2, the INTEGER signal from subtractor 54 is essentially a coarse adjustment for synchronizing the phase of the output of voltage controlled oscillator 50 to an incoming analog video signal. For example, if the detection of the transition 23a of the horizontal sync pulse of the digitized video, here characterized by output signal VDH, does not occur at the same time as the reset of oscillator pixel counter 52 by decoder 56 that divides by 780, the counts of video pixel counter 46 and oscillator pixel counter 52 will not be the same. Under such condition, an INTEGER error signal will be output by subtractor 54 to adder 48. The INTEGER phase error signal operates within phase locked loop 53 to adjust or correct the output of voltage controlled oscillator 50. That is, INTEGER phase error functions to increase or decrease the frequency of voltage controlled oscillator 50 to be synchronized with the incoming analog signal into analog to digital converter 26. When the output of decoder 56 is synchronized with the signal VDH, then the counts of video pixel counter 46 and oscillator pixel counter 52 are the same. Under such condition, INTEGER error signal will be 0 and no coarse correction will occur because the VCO 50 is locked to the incoming analog signal in frequency and phase. However, notwithstanding this INTEGER synchronization, VCO 50 could still jitter because the relative position of the threshold crossing in the sample interval could vary from horizontal sync pulse to horizontal sync pulse.

The FRACTION signal functions to eliminate or reduce subpixel clock jitter by providing a fractional or subpixel phase correction signal representing the deviation or phase difference between the crossing of the threshold value T and a predetermined point within the sample interval I. Here, the predetermined point is the midpoint of the sample interval as determined by interpolation. This fractional phase correction signal FRACTION is summed with the INTEGER error signal in adder 48, and is used to adjust the subpixel phase of VCO 50. By such arrangement, the pixel sample clock is adjusted to provide a predetermined relationship between threshold T and future sample intervals at the time of crossings. That is, the threshold T will here occur at the midpoint of sample intervals for subsequent crossings. Thus, the pixel sample clock is further stabilized to prevent subpixel jitter.

This concludes the Description of the Preferred Embodiment. However, a reading of it by one skilled in the art will bring to mind many alterations and modifications that do not depart from the spirit and scope of the invention. Therefore, it is intended that the scope of the invention be limited only by the appended claims.

What is claimed is:

1. Apparatus adapted to receive a threshold value and a sequence of digital samples of a substantially linear portion of an analog signal wherein the sequence of digital samples crosses the threshold value, said apparatus comprising:

threshold crossing detector means for providing a first output signal when a first one of said digital samples is detected as having crossed said threshold value, said threshold crossing detector means comprising means for detecting a sign difference between S(i)-T and S(i−1)-T where S(i) is the value of said first one of said digital samples to cross said threshold value, S(i−1) is the value of the immediately preceding digital sample before the threshold value was crossed, and T is the threshold value; and means for providing a second output signal in accordance with a relative position of said threshold value between the value of said first one of said digital samples to cross said threshold value and the value of a preceding digital sample before said threshold value was crossed.

2. The apparatus recited in claim 1 wherein said second output signal providing means comprises means for comparing the threshold value to an interpolated value at the midpoint between the values of S(i) and S(i−1).

3. The apparatus recited in claim 2 wherein said second output signal providing means further comprises means for comparing the threshold value to successive iteration values between said midpoint value and the closer one of the values of S(i) and S(i−1).

4. The apparatus recited in claim 1 wherein said second output signal providing means comprises means for providing a phase error signal when the threshold value is not substantially equal to a predetermined value at or between the values of S(i) and S(i−1).

5. The apparatus recited in claim 1 wherein said second output signal providing means comprises means for comparing the value of S(i−1)-T with [S(i−1)-S(i)]/2.

6. The apparatus recited in claim 1 wherein said sequence of digital samples comprises digital samples of a video signal.

7. Apparatus adapted to receive a threshold value corresponding to a voltage level and a sequence of digital samples of a substantially linear portion of an analog signal wherein the sequence of digital samples crosses the threshold value from either greater to lesser or lesser to greater value wherein S(i) is the first digital sample of the sequence to cross the threshold value and S(i−1) is the immediately preceding digital sample of lesser or greater value than the threshold value received before the sequence crossed the threshold value, the apparatus comprising:

threshold crossing detector means for providing a first output signal responsive to the value of S(i) crossing the threshold value; and fractional resolution detector means responsive to the threshold value and the values of S(i) and S(i−1) for interpolating between S(i) and S(i−1) to provide a second output signal representative of when the threshold value was crossed during the time interval between digital samples S(i−1) and S(i), said fractional resolution detector means comprising means for comparing the threshold value to a value at the midpoint between the values of S(i) and S(i−1).

8. The apparatus recited in claim 7 wherein said fractional resolution detector means further comprises means for comparing the threshold value to successive iteration values between said midpoint value and the closer one of the values of S(i) and S(i−1).

9. Apparatus comprising:

analog to digital converter means responsive to an analog video signal having periodic substantially linear synchronization regions for providing a sequence of digital samples at intervals in accordance with a pixel sample clock;

means for providing a threshold value corresponding to a predetermined level of said synchronization region of said analog video signal;

synchronization detector means responsive to said threshold value and the sequence of digital samples for providing a first control signal when a first one of said sequence of digital samples crosses said threshold value;

said synchronization detector means further comprising means for interpolating between S(i) and S(i−1) to provide a second control signal representative of when the threshold signal was crossed during the time interval between S(i) and S(i−1) where S(i) is said first one of said sequence of digital samples to cross said threshold value and S(i−1) is the immediately preceding digital sample before said threshold value was crossed; and means responsive to said first and second control signals for adjusting said pixel sample clock to synchronize said pixel sample clock with said analog video signal and to cause said pixel sample clock to have a subpixel phase wherein a subsequent crossing of said threshold value occurs at a predetermined position in the time interval between two consecutive digital samples where one of the two consecutive digital samples occurs before and the other after the subsequent crossing.

10. The apparatus recited in claim 9 wherein said adjusting means comprises a phase locked loop comprising a voltage controlled oscillator.

11. The apparatus recited in claim 10 wherein said adjusting means further comprises means responsive to said voltage controlled oscillator for generating a local signal corresponding to said first control signal.

12. The apparatus recited in claim 11 wherein said adjusting means further comprises phase detector means for providing an integer error signal in accordance with a phase relationship between said first control signal and said corresponding local signal.

13. The apparatus recited in claim 12 wherein said adjusting means further comprises means for summing said integer error signal and said second control signal to produce a composite error signal.

14. The apparatus recited in claim 13 wherein said voltage controlled oscillator is responsive to said composite error signal.

15. The apparatus recited in claim 9 wherein, in said predetermined position, said threshold value is equal to the midpoint between the values of S(i) and S(i−1).

16. A method of detecting a sequence of digital samples of a substantially linear region of an analog signal crossing a threshold value, comprising the steps of:

providing a first output signal when a first one of said digital signals is detected as having crossed said threshold value wherein said first output signal providing step comprises a step of detecting a sign difference between S(i)-T and S(i−1)-T where S(i) is the value of said first one of said digital samples to cross said threshold value, S(i−1) is the value of the immediately preceding digital sample before the threshold value was crossed, and T is the threshold value; and providing a second output signal corresponding to a relative position of the threshold value between the value of said first one of said digital samples to cross said threshold value and the value of a preceding digital sample before said threshold value was crossed.

17. The method recited in claim 16 wherein the second output signal providing step comprises a step of comparing the threshold value to a value at the midpoint between the values of S(i) and S(i−1).

18. The method recited in claim 16 wherein said second output signal providing step comprises a step of comparing the value of S(i−1)-T with [S(i−1)-S(i)]/2.

19. A method of detecting a sequence of digital sample of a substantially linear region of an analog signal crossing a threshold value corresponding to a voltage level wherein time intervals between consecutive digital samples is determined by a sampling clock, comprising the steps of:

providing a first output signal when a first one of said digital samples is detected to have crossed said threshold value, wherein said first output signal providing step comprises a step of detecting a sign difference between S(i)-T and S(i−1)-T where S(i) is the value of said first one of said digital samples to cross said threshold value, S(i−1) is the value of the immediately preceding digital sample before the threshold value was crossed, and T is the threshold value; and interpolating between values of S(i) and S(i−1) to provide a second output signal representing when the threshold value was crossed during the time interval between S(i) and S(i−1) where S(i) is said first one of said digital samples and S(i−1) is the immediately preceding digital sample.

20. A method of digitizing an analog video signal having periodic substantially linear synchronization regions, comprising the steps of:

converting the analog video signal to a sequence of digital samples at intervals in accordance with a pixel sample clock;

providing a threshold value corresponding to a predetermined level of said synchronization region of said analog video signal;

providing a first control signal when a first one of said sequence of digital samples crosses said threshold value;

providing a second control signal in accordance with the threshold value relative to values of S(i) and S(i−1) where S(i) is said first one of said sequence of digital samples to cross said threshold value and S(i−1) is the immediately preceding digital sample before said threshold value was crossed;

adjusting in response to the first signal the phase and frequency of said pixel sample clock into coincidence with said analog video signal; and adjusting in response to the second control signal the subpixel phase of said pixel sample clock to provide a predetermined relationship between said threshold value and subsequent values of consecutive digital samples immediately before and immediately after crossing said threshold value.

21. The method recited in claim 20 wherein said adjusting steps comprise a step of locking a phase locked loop comprising a voltage controlled oscillator.

22. The method recited in claim 21 wherein said adjusting steps further comprise a step of generating in response to the voltage controlled oscillator a local signal corresponding to said first control signal.

23. The method recited in claim 22 wherein said adjusting steps further comprise a step of providing an integer error signal in accordance with a phase relationship between said first control signal and said corresponding local signal.

24. The method recited in claim 23 wherein said adjusting steps further comprise a step of summing said integer error signal and said second control signal to produce a composite error signal.

25. The method recited in claim 24 wherein said voltage controlled oscillator is responsive to said composite error signal.

26. The method recited in claim 20 wherein, in said predetermined relationship, said threshold value is equal to the midpoint between the values of S(i) and S(i−1).

* * * * *